US010283311B2

(12) United States Patent
Jeong et al.

(10) Patent No.: US 10,283,311 B2
(45) Date of Patent: May 7, 2019

(54) X-RAY SOURCE

(71) Applicant: ELECTRONICS AND TELECOMMUNICATIONS RESEARCH INSTITUTE, Daejeon (KR)

(72) Inventors: Jin-Woo Jeong, Daejeon (KR); Yoon-Ho Song, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 175 days.

(21) Appl. No.: 15/230,276

(22) Filed: Aug. 5, 2016

(65) Prior Publication Data

US 2017/0053771 A1 Feb. 23, 2017

(30) Foreign Application Priority Data

Aug. 21, 2015 (KR) ........................ 10-2015-0118213
Apr. 4, 2016 (KR) ........................ 10-2016-0041149

(51) Int. Cl.

*H01J 37/065* (2006.01)
*H01J 35/06* (2006.01)
*H01J 35/04* (2006.01)
*H01J 35/16* (2006.01)

(52) U.S. Cl.

CPC .......... *H01J 35/065* (2013.01); *H01J 35/045* (2013.01); *H01J 35/16* (2013.01); *H01J 2235/168* (2013.01)

(58) Field of Classification Search

CPC ........ H01J 35/065; H01J 35/14; H01J 35/045; H01J 35/16

See application file for complete search history.

(56) References Cited

U.S. PATENT DOCUMENTS 8,761,343 B2 6/2014 Jeong et al.
9,042,520 B2 * 5/2015 Jeong ...................... H01J 35/20 378/123
9,048,059 B2 6/2015 Jeong et al.
2005/0213709 A1 * 9/2005 Dinsmore ............. H01J 35/065 378/119
2008/0238285 A1 * 10/2008 Hong ...................... H01J 9/025 313/309

(Continued)

FOREIGN PATENT DOCUMENTS

KR 10-2012-0064783 A 6/2012
KR 10-2013-0084257 A 7/2013
KR 10-2013-0101839 A 9/2013

OTHER PUBLICATIONS

"ETRI Creative Research Sections Project", Jan. 2016, pp. 190-206.

*Primary Examiner* — Kenneth J Malkowski

(57) ABSTRACT

Disclosed is an X-ray source, including: a cathode; an anode positioned on the cathode so as to face the cathode; emitters formed on the cathode; a gate electrode positioned between the cathode and the anode and including openings at positions corresponding to those of the emitters; an insulating spacer formed between the gate and the anode; and a coating layer formed on an internal wall of the insulating spacer, and including a material having a lower secondary electron emission coefficient than that of the insulating spacer.

11 Claims, 5 Drawing Sheets

(56) References Cited

U.S. PATENT DOCUMENTS

| | | | | |
|---|---|---|---|---|
| 2011/0114830 | A1* | 5/2011 | Reijonen | H01J 35/04 250/251 |
| 2012/0148027 | A1* | 6/2012 | Jeong | H01J 35/065 378/106 |
| 2013/0235976 | A1 | 9/2013 | Jeong et al. | |

* cited by examiner

X-RAY SOURCE

CROSS-REFERENCE TO RELATED APPLICATION

The present application claims priority to Korean Patent Application Numbers 10-2015-0118213 filed on Aug. 21, 2015 and 10-2016-0041149 filed on Apr. 4, 2016, in the Korean Intellectual Property Office, the entire disclosure of which is incorporated by reference herein.

BACKGROUND

1. Field

The present disclosure relates to an X-ray source, and more particularly, to an X-ray tube having a stable characteristic at a high voltage.

2. Description of the Related Art

An X-ray tube generates electrons at the inside of a vacuum container, accelerates the electrons at an anode direction, in which a high voltage is applied, and makes the electrons collide with a metal target the anode to generate an X-ray. In this case, a voltage difference between the anode and a cathode is defined as an accelerating voltage, which accelerates the electrons, and accelerates the electrons at the accelerating voltage of several to several hundreds of kV depending on a usage of an X-ray tube. A gate electrode, a focusing electrode, and the like are present between the anode and the cathode.

SUMMARY

The present disclosure has been made in an effort to solve the above-described problems associated with the prior art, and provides an X-ray source having a stable characteristic when a high voltage is applied.

An exemplary embodiment of the present disclosure provides an X-ray source, including: a cathode; an anode positioned on the cathode so as to face the cathode; emitters formed on the cathode; a gate electrode positioned between the cathode and the anode and including openings at positions corresponding to those of the emitters; an insulating spacer formed between the gate and the anode; and a coating layer formed on an internal wall of the insulating spacer, and including a material having a lower secondary electron emission coefficient than that of the insulating spacer.

An exemplary embodiment of the present disclosure provides an X-ray source, including: a cathode; an anode positioned on the cathode so as to face the cathode; emitters formed on the cathode; a gate electrode positioned between the cathode and the anode and including openings at positions corresponding to those of the emitters; an insulating spacer positioned under the cathode; and a coating layer formed on an upper surface of the insulating spacer, and including a material having a lower secondary electron emission coefficient than that of the insulating spacer.

The coating layer, which has a lower secondary electron emission coefficient than that of the insulating spacer, is formed on the insulating spacer. Accordingly, it is possible to decrease the generation of the secondary electrons, so that it is possible to manufacture the X-ray source having a stable characteristic at a high voltage.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE INVENTION

Figure 1A:
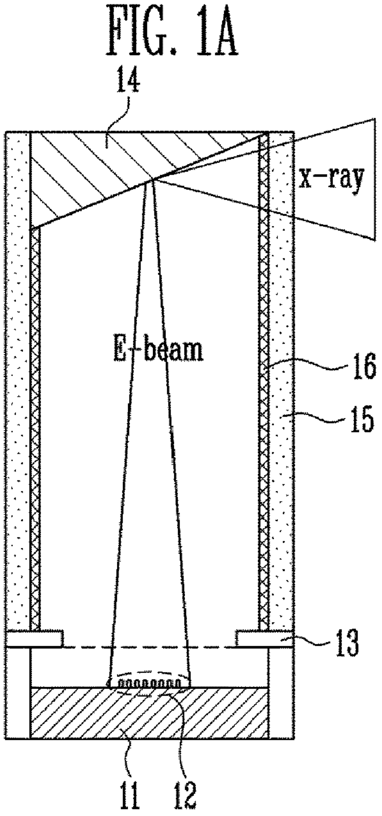
FIGS. 1A to 1D are cross-sectional views illustrating a structure of an X-ray source according to an exemplary embodiment of the present disclosure.

Hereinafter, the exemplary embodiments of the present disclosure will be described with reference to the accompanying drawings in detail so that those skilled in the art may easily carry out the present disclosure.

FIGS. 1A to 1D are cross-sectional views illustrating a structure of an X-ray source according to an exemplary embodiment of the present disclosure.

Referring to FIGS. 1A to 1D, an X-ray source according to an exemplary embodiment of the present disclosure includes a cathode 11, emitters 12, a gate electrode 13, an anode 14, an insulating spacer 15, and a coating layer 16.

The cathode 11 may be positioned so as to face the anode 14, and the anode 14 may be positioned on the cathode 11 while being spaced apart from the cathode 11 at a predetermined distance. A lower surface of the anode 14, that is, a surface of the anode facing the cathode 11, may be inclined at a predetermined angle.

The emitters 12 are formed on the cathode 11. For example, the emitters 12 may be carbon nano tube emitters, and may be arranged in a dot array form. The gate electrode 13 may be positioned on the cathode 11, and may include openings at positions corresponding to those of the emitters 12. When a plurality of emitters 12 is formed on the cathode 12, the gate electrode 13 includes a plurality of openings. For example, the gate electrode 13 may have a mesh form.

The insulating spacer 15 may be formed between the gate 13 and the anode 14, and may have a tube form. An E-beam is generated and accelerated in a vacuum atmosphere, so that an X-ray source needs to be completely sealed or continuously maintain a degree of inside vacuum through a vacuum pump. Accordingly, the insulating spacer 15 may be formed of a material, such as ceramic, an aluminum oxide, an aluminum nitride, and glass, having an excellent high voltage characteristic.

The coating layer 16 is formed on the insulating spacer 15. The coating layer 16 is for the purpose of preventing the insulating spacer 15 and the electrons from colliding with each other and secondary electrons from being generated, and includes a material having a lower secondary electron emission coefficient than that of the insulating spacer 15, for example, a material having a secondary electron emission coefficient of 1 or less. For example, the coating layer 16 includes a chromic oxide ($Cr_2O_3$), a titanium oxide ($TiO_2$).

According to the aforementioned structure, the E-beam emitted from the emitters 12 passes through the opening of the gate electrode 13 and is focused at the anode 14, and the E-beam collides with the anode 14 to generate an X-ray.

However, when the accelerating voltage is increased, a triple junction, at which three materials, that is, vacuum, a metal, and a dielectric substance (the insulating spacer), meet, is generated in a region of the insulating spacer 15, in which the voltage is relatively low. Further, an electric field is concentrated at the triple junction, so that an abnormal emission of the electrons and the like may be caused. Particularly, since the material used as the insulating spacer 15 has a high secondary electron generation coefficient, a lot of secondary electrons may be generated by the electrons generated at the triple junction or the electrons emitted from the emitters 12. In this case, an internal wall of the insulating spacer 15 may be electrified with positive (+) charges, and thus an operation of the X-ray source may become unstable. Otherwise, the electrified charges may be discharged, so that the X-ray source may be damaged.

Accordingly, in the X-ray source according to the exemplary embodiment of the present disclosure, the coating layer 16 is formed on the insulating spacer 15. If the coating layer 16 is coated on the internal wall of the insulating spacer 15, it is possible to prevent the charges from being accumulated on the internal wall of the insulating spacer 15 by the abnormal electrons generated at the triple junction, the electrons generated in the emitters 12, and the like. Here, the coating layer 16 may be formed on the entirety or a part of the internal wall of the insulating spacer 15. Further, the coating layer 16 may be formed of a single material, or may be formed of a plurality of materials having different secondary electron generation coefficients.

Referring to FIG. 1A, the coating layer 16 may be formed on the entire internal wall of the insulating spacer 16 exposed between the gate electrode 13 and the anode 14. In this case, the insulating spacer 15 is not exposed between the gate electrode 13 and the anode 14.

Figure 1B:
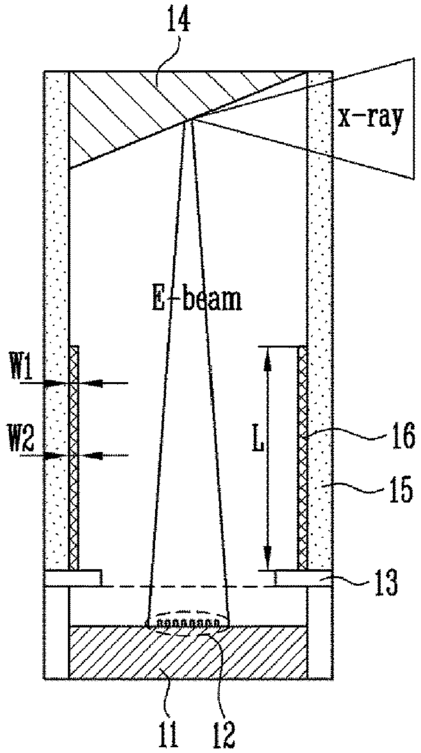

Referring to FIG. 1B, the coating layer 16 may be formed on only a partial region of the internal wall of the insulating spacer 16 exposed between the gate electrode 13 and the anode 14. For example, the coating layer 16 may be formed on only a region, in which a frequency of the generation of the secondary electrons is relatively high, that is, a region having a low potential. Accordingly, the coating layer 16 may be formed in only a surrounding region of the gate electrode 13 in the internal wall of the insulating spacer 15 so as to expose a region of the insulating spacer 15 adjacent to the anode 14. Here, a length L of the region, in which the coating layer 16 is formed, may be determined in consideration of a characteristic of the X-ray source, for example, a vacuum E-beam device.

For reference, in a case of a structure, in which the E-beam does not pass through a space having a vacuum atmosphere, it is possible to obtain a high withstand voltage characteristic by forming the coating layer 16. However, when the E-beam passes through the space having the vacuum atmosphere and reaches the anode 14, a surrounding region of the anode 14 may be electrified with a lower potential than the voltage of the anode by the coating layer 16 and may become unstable. Accordingly, it is possible to promote the stability by locating the material having a relatively high secondary electron emission coefficient in the surrounding region of the anode 14 by exposing the insulating spacer 15 in the surrounding region of the anode 14 by controlling the region, in which the coating layer 16 is formed. Further, the coating layer 16 may generally have a uniform thickness (W1=W2) or may have a decreasing thickness (W1<W2) while being closer to the anode 14.

Figure 1C:
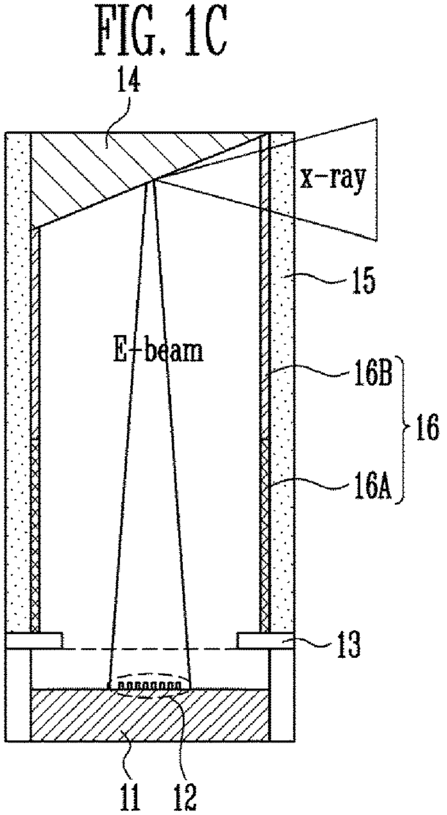

Referring to FIG. 1C, the coating layer 16 may include a plurality of material layers 16A and 16B having different secondary electron generation coefficients. For example, the coating layer 16 may include a first layer 16A formed in a partial region of the internal wall of the insulating spacer 15, which is exposed between the gate electrode 13 and the anode 14, adjacent to the gate electrode 13, and a second layer 6B formed in a partial region of the internal wall of the insulating spacer 15, which is exposed between the gate electrode 13 and the anode 14, adjacent to the anode 14. Here, the first layer 16A and the second layer 16B may be formed of the same material or different materials. Further, the secondary electron emission coefficient of the first layer 16A and the secondary electron emission coefficient of the second layer 16B may have the same value or different values. For example, the second layer 16B may be formed of a material having a lower secondary electron emission coefficient than that of the first layer 16A, or the second layer 16B may be formed of a material having a greater secondary electron emission coefficient than that of the first layer 16A.

Figure 1D:
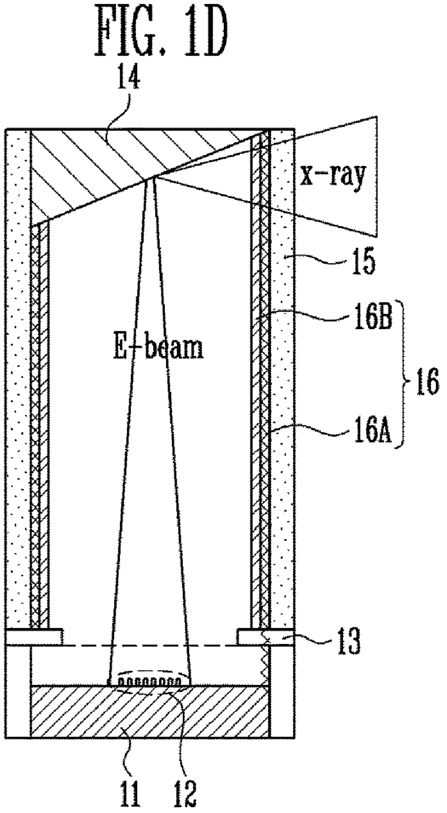

Referring to FIG. 1D, the coating layer 16 may have a form, in which the plurality of layers 16A and 16B are laminated. For example, the coating layer 16 may include the first layer 16A formed on the internal wall of the insulating spacer 15 exposed between the gate electrode 13 and the anode 14 and the second layer 16B formed on the first layer 16A. Here, the first layer 16A and the second layer 16B may be formed of the same material or different materials. Further, the secondary electron emission coefficient of the first layer 16A and the secondary electron emission coefficient of the second layer 16B may have the same value or different values. For example, the second layer 16B may be formed of a material having a lower secondary electron emission coefficient than that of the first layer 16A, or the second layer 16B may be formed of a material having a greater secondary electron emission coefficient than that of the first layer 16A.

In the meantime, the form of the coating layer 16 described with reference to FIGS. 1A to 1D is only an example, and the present disclosure is not limited thereto. For example, the coating layer 16 may also be formed by combining the aforementioned forms.

Figure 2A:
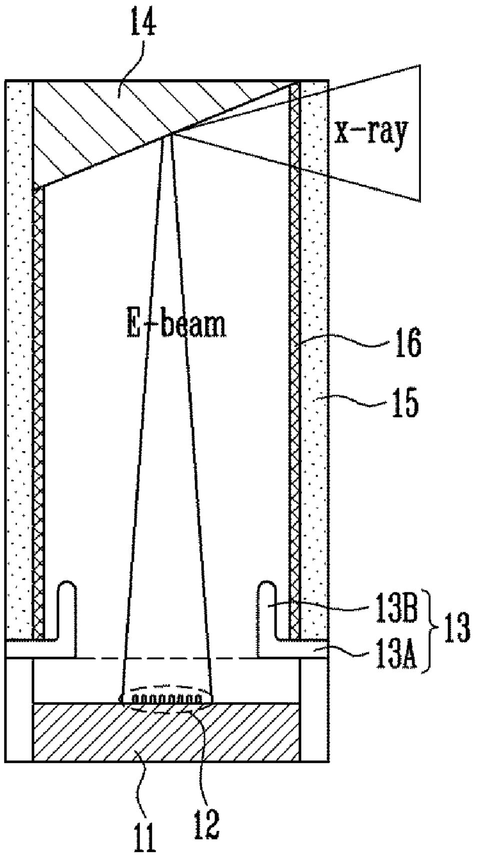
FIGS. 2A and 2B are cross-sectional views illustrating a structure of an X-ray source according to an exemplary embodiment of the present disclosure.
Figure 2B:
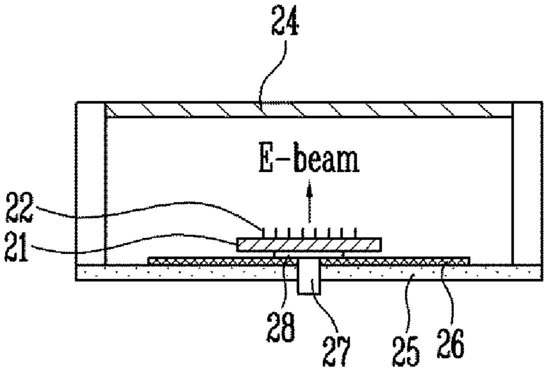

FIGS. 2A and 2B are cross-sectional views illustrating a structure of an X-ray source according to an exemplary embodiment of the present disclosure. Hereinafter, contents overlapping the aforementioned description will be omitted.

Referring to FIG. 2A, an X-ray source according to an exemplary embodiment of the present disclosure includes a cathode 11, emitters 12, a gate electrode 13, an anode 14, an insulating spacer 15, and a coating layer 16. Here, the gate electrode 13 may have a structure partially inserted into the insulating spacer 15. For example, the gate electrode 13 may have a form bent toward the anode 14 in a surrounding region of an opening. In this case, the gate electrode 13 may include a first region 13A which is parallel to an upper surface of the cathode 11, and a second region 13B which is connected with the first region 13A and is bent at a predetermined angle. The angle, at which the second region 13B is bent, is adjusted in a degree, in which the gate electrode 13 is not in contact with the coating layer 16. Accordingly, it is possible to secure high voltage stability of the X-ray source by restraining an electric field generated at a triple junction.

Further, in the present drawing, the case where the X-ray source includes the coating layer 16 described with reference to FIG. 1A is illustrated, but the coating layer 16 may have various forms described with reference to FIGS. 1A to 1D, or a combination form thereof.

Referring to FIG. 2B, an X-ray source according to an exemplary embodiment of the present disclosure includes a cathode 21, emitters 22, an anode 24, an insulating spacer 25, and a coating layer 26. Further, a spacer 28 and a terminal 27 may be positioned under the cathode 21. The spacer 28 may be for the purpose of forming a gap between the coating layer 26 and the cathode 21, and the terminal 27 may be for the purpose of applying a voltage from the outside. Although not illustrated in the present drawing, the E-ray source may further include a gate electrode, a focusing electrode, and the like.

Here, the insulating spacer 25 may be positioned under the cathode 21, and may have a plate form. The coating layer 26 is formed on an upper surface of the insulating spacer 25, and is positioned in a surrounding region of the cathode 21. For example, the coating layer 26 may be interposed between the spacer 28 and the insulating spacer 25, and may be positioned under the cathode 21. Further, the coating layer 26 may be formed with a larger area than that of the cathode 21. Accordingly, it is possible to efficiently prevent an electric field from being concentrated at a triple junction.

Figure 3A:
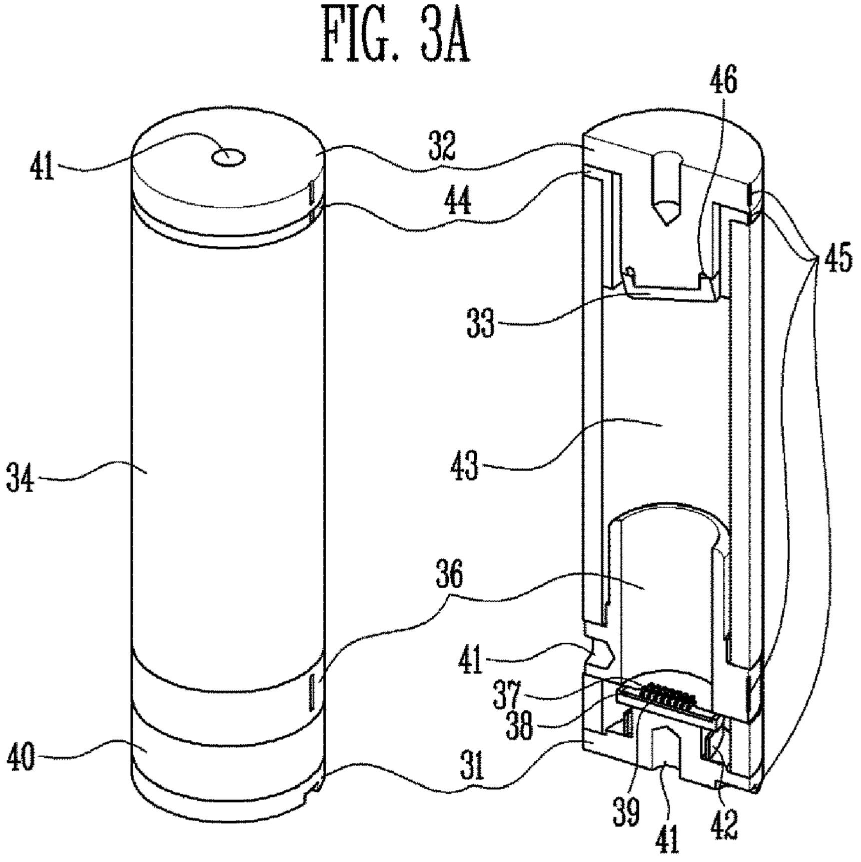
FIGS. 3A and 3B are perspective views illustrating a structure of an X-ray source according to an exemplary embodiment of the present disclosure.
Figure 3B:
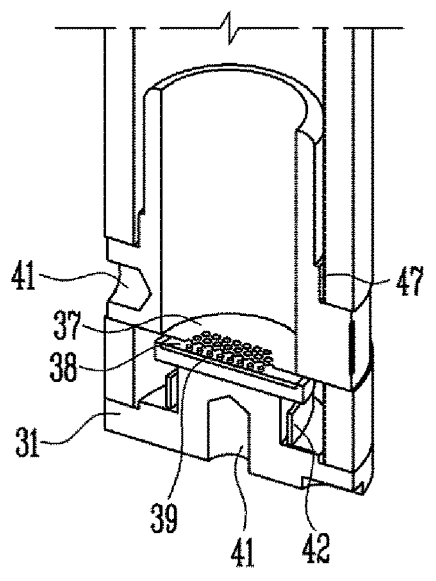

FIGS. 3A and 3B are perspective views illustrating a structure of an X-ray source according to an exemplary embodiment of the present disclosure, and are design drawings for manufacturing the X-ray source. FIG. 3A illustrates external and internal structures of the X-ray source, and FIG. 3B illustrates an enlarged inside of a lower side of the X-ray source.

Referring to FIGS. 3A and 3B, the X-ray source may include a cathode 31, an anode 32, an anode target 33, an insulating spacer 34, a gate electrode 36, a gate mesh 37, carbon nano tube emitters 38, a cathode sheet 39, a gate spacer 40, a screw tap 41, a non-volatile getter 42, a coating layer 43, and a braising adapter 44, or may include some thereof. An X-ray tube may be a small X-ray tube, of which a diameter is about 15 mm and a length is about 56 mm.

The cathode 31 and the anode 32 are positioned while facing each other, and the anode 32 is positioned on the cathode 31. The cathode sheet 39 may be attached onto an upper surface of the cathode 31, and the carbon nano tube emitters 38 may be formed on the cathode sheet 39 in a dot array form. The anode target 33 may be attached onto a lower surface of the anode 32.

The insulating spacer 34 having a tube form is positioned between the cathode 31 and the anode 32. The coating layer 43 may be formed on an internal wall of the insulating spacer 34. Here, the coating layer 43 is formed of a material having a lower secondary electron emission coefficient than that of the insulating spacer 34, and may have various forms described with reference to FIGS. 1A to 1D. For example, the insulating spacer 34 may include an aluminum oxide ($Al_2O_3$), and the coating layer 43 may include a chromic oxide ($Cr_2O_3$) or a titanium oxide ($TiO_2$).

The gate electrode 36 may be positioned between the cathode 31 and the anode 32, and the gate spacer 40 may be positioned between the gate electrode 36 and the cathode 31. The gate electrode 36 may be positioned between the cathode 31 and the anode 32, and may include the gate mesh 37. The gate mesh 37 may include gate holes formed at a position corresponding to the array of the carbon nano tube emitters 38. A thickness of the gate mesh may be about 0.1 mm.

The gate electrode 36 may have a cylindrical structure inserted into the insulating spacer 34, and for example, the gate electrode 36 may be inserted into the insulating spacer in about 10 mm. As described above, when the gate electrode 36 is formed in the cylindrical structure inserted into the insulating spacer 34, the electrons which pass through the gate mesh 37 may be easily focused to the anode target 33. That is, it is not necessary to form a separate focusing electrode for focusing the E-beam.

Further, the screw tap 41 may be formed on an exterior surface of the anode 32, that is, an exterior surface of the cathode 31 and an exterior surface of the gate electrode 36, and the braising adapter 44 may be formed between the insulating spacer 34 and the anode 32. The non-volatile getter 42 may be located between the cathode 31 and the gate spacer 40, and an alignment recess may be formed on exterior surfaces of the anode 32, the braising adapter 44, the gate electrode 36, the cathode 31, and the like. Further, the gate electrode 36 may include an alignment protrusion 47 in an exterior surface thereof which is in contact with the internal wall of the insulating spacer 34.

A filler overflow preventing recess 46 may be formed around the anode target 33. Accordingly, even though a braising filler made of a metal is diffused to a surface of the anode target during a process of bonding the anode target to the anode electrode by a vacuum braising process, it is possible to prevent a contamination by the filler overflow preventing recess 46.

Figure 4A:
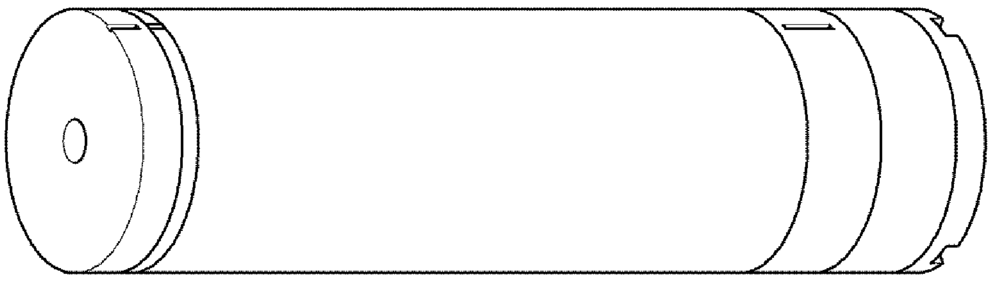
FIG. 4A is a picture of an actual manufacturing example of the X-ray source according to the exemplary embodiment of the present disclosure.
Figure 4B:
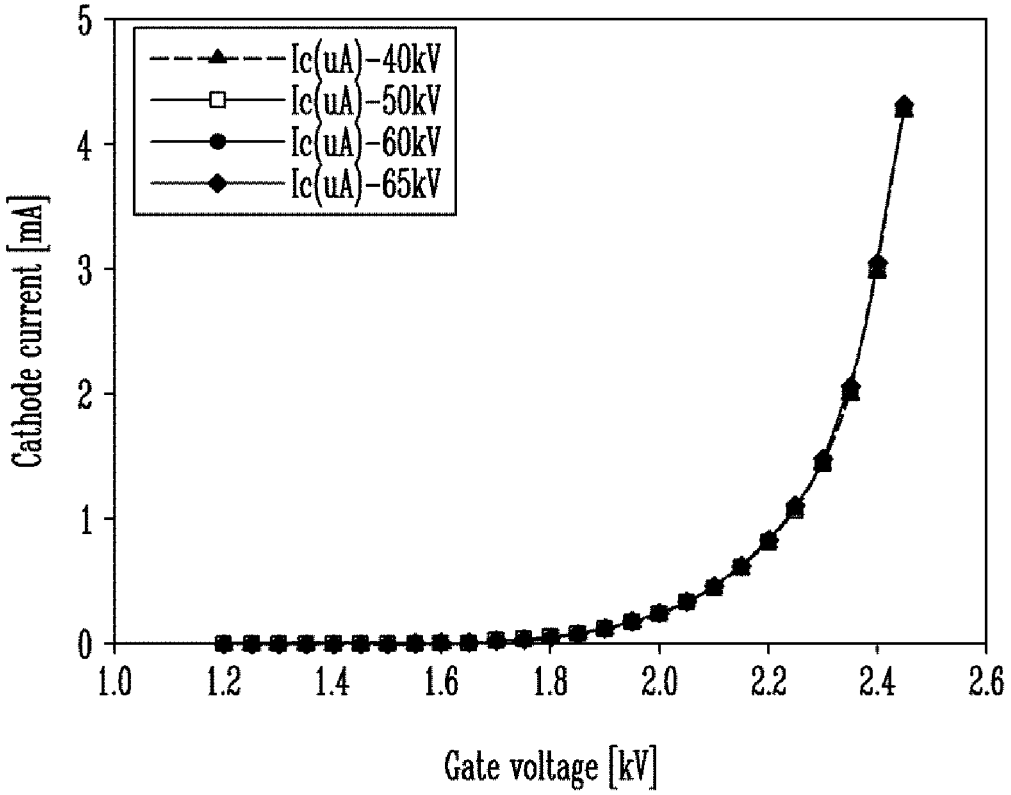
FIG. 4B is a graph representing a result of a measurement of a characteristic of the X-ray source of FIG. 4A.

FIG. 4A is a picture of an actual manufacturing example of the X-ray source according to the exemplary embodiment of the present disclosure, and FIG. 4B is a graph representing a result of a measurement of a characteristic of the X-ray source of FIG. 4A.

Referring to FIG. 4A, a small X-ray tube having a diameter of 15 mm and a length of 56 mm was manufactured according to the design drawings described with reference to FIGS. 3A and 3B. During the manufacturing, the coating layer 43 was formed by sputtering a chrome oxide ($Cr_2O_3$) on the internal wall of the insulating spacer 34 formed of an aluminum oxide ($Al_2O_3$) and then performing a vacuum heat treatment at 1,000° C. to 1,200° C. Next, the X-ray tube was vacuum sealed by a braising process.

When the coating layer 43 is formed, it is difficult to perform the sputtering process at a heating atmosphere due to a volume of the insulating spacer 34, a phase of a chrome oxide ($Cr_2O_3$) may not be properly formed. Accordingly, a post heat treatment process was performed after the sputtering process. For reference, if it is possible to perform the sputtering on the insulating spacer 34, which is formed of an aluminum oxide, at a heating atmosphere at 500° C. or higher, the post heat treatment process may be omitted.

The gate electrode 36 was inserted into the insulating spacer 34 by 10 mm. Further, the alignment protrusion 47 was formed on the exterior surface of the gate electrode 36 so that a distance between the gate electrode 36 and the internal wall of the insulating spacer 34 is 0.5 mm. In the present exemplary embodiment, the X-ray tube was manufactured so that the insertion distance is 10 mm and the spaced distance is 0.5 mm, but the insertion distance and the spaced distance may be changed depending on a tube condition.

The braising adapter 44 was formed of a Kovar alloy. When the insulating spacer 34 is formed of an aluminum oxide and the anode 32 is formed of copper having excellent thermal conductivity, a braising bonding property between the aluminum oxide and the copper is not good. Accordingly, the braising bonding property between the insulating spacer 34 and the anode 32 was improved by forming the braising adapter 44 with the Kovar alloy.

The braising adapter 44 was formed in a structure surrounding a surrounding region of the anode target 33 so as to seal a gap between the anode target 33 and the internal wall of the insulating spacer 34. Accordingly, the electrons, which were emitted from the carbon nano tube emitters 38 and accelerated, or the back scattered electrons were prevented from escaping through the gap between the anode target 33 and the internal wall of the insulating spacer 34.

The electrodes, such as the cathode 31, the gate electrode 36, and the anode 32, and the insulating spacer 34 were bonded by the vacuum braising process. Further, the anode 32 and the anode target 33, and the cathode sheet 39 and the cathode 31 were bonded by the vacuum braising process. The braising filler made of the metal may be diffused to the surface of the anode target 33 and a contamination may be generated during the process of bonding the anode target 33 and the anode 32 by the vacuum braising process, but the contamination was prevented by the filler overflow preventing recess 46.

Referring to FIG. 4B, an electric field emission characteristic according to a gate voltage was measured while changing a voltage applied to the anode 32 of the X-ray source, which is actually manufactured according to the exemplary embodiment of the present disclosure. An X-axis of the graph represents a gate voltage and a Y-axis represents a cathode current. As a result of the measurement of the cathode current according to the gate voltage while increasing the voltage applied to the anode 32 to 40 kV, 50 kV, 60 kV, and 65 kV, it was confirmed that the X-ray source was stably driven at a high voltage.

The technical spirit of the present disclosure have been described according to the exemplary embodiment in detail, but the exemplary embodiment has described herein for purposes of illustration and does not limit the present disclosure. Further, those skilled in the art will appreciate that various modifications may be made without departing from the scope and spirit of the present disclosure.

What is claimed is:

1. An X-ray source, comprising:

a cathode;

an anode positioned to face the cathode;

emitters formed on the cathode;

a gate electrode positioned between the cathode and the anode and including openings at positions corresponding to those of the emitters;

an insulating spacer formed between the gate and the anode; and a coating layer formed on an internal wall of the insulating spacer, and including a material having a lower secondary electron emission coefficient than that of the insulating spacer, wherein the coating layer is only present on portions of the internal wall that are closer to the cathode, and exposed portions of the internal wall that are closer to the anode are free from the coating layer.

2. The X-ray source of claim 1, wherein the coating layer prevents the insulating spacer and the electrons from colliding with each other and secondary electrons from being generated.

3. The X-ray source of claim 1, wherein the coating layer includes a chromic oxide ($Cr_2O_3$) or a titanium oxide ($TiO_2$).

4. The X-ray source of claim 1, wherein the insulating spacer has a tube form.

5. The X-ray source of claim 1, wherein a thickness of the coating layer decreases as the coating layer approaches the anode.

6. The X-ray source of claim 1, wherein the coating layer includes:

a first layer; and a second layer having a different secondary electron emission coefficient from that of the first layer.

7. The X-ray source of claim 1, wherein the coating layer includes:

a first layer formed on an internal wall of the insulating spacer which is exposed between the gate electrode and the anode; and a second layer formed on the first layer and having a different secondary electron emission coefficient from that of the first layer.

8. The X-ray source of claim 1, wherein the gate electrode has a form bent toward the anode in a surrounding region of the opening.

9. The X-ray source of claim 1, wherein the emitter is a carbon nano tube emitter.

10. The X-ray source of claim 1, wherein the gate electrode has a mesh form.

11. The X-ray source of claim 1, wherein an exposed surface of the anode is inclined at a non-normal angle with respect to an axis of the cylinder.

* * * * *